United States Patent
Chou

(10) Patent No.: US 8,269,535 B1
(45) Date of Patent: Sep. 18, 2012

(54) DELAY-LOCKED LOOP AND METHOD OF USING THE SAME

(75) Inventor: Min-Chung Chou, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 0 days.

(21) Appl. No.: 13/183,474

(22) Filed: Jul. 15, 2011

(51) Int. Cl.
*H03L 7/06* (2006.01)

(52) U.S. Cl. .......................... 327/158; 327/149

(58) Field of Classification Search .................. 327/149, 327/158
See application file for complete search history.

(56) References Cited

U.S. PATENT DOCUMENTS

| | | | |
|---|---|---|---|
| 6,621,315 B2 | 9/2003 | Heo et al. | |
| 7,015,737 B2 * | 3/2006 | Cho | 327/158 |
| 8,081,023 B2 * | 12/2011 | Nguyen | 327/231 |
| 2004/0100312 A1 * | 5/2004 | Cho | 327/158 |
| 2004/0227550 A1 | 11/2004 | Byun | |
| 2007/0182471 A1 * | 8/2007 | Kim | 327/158 |
| 2008/0080267 A1 * | 4/2008 | Lee | 365/191 |
| 2011/0175654 A1 * | 7/2011 | Lee | 327/158 |
| 2011/0234281 A1 * | 9/2011 | Kim | 327/158 |

* cited by examiner

*Primary Examiner* — Lincoln Donovan
*Assistant Examiner* — Adam Houston
(74) *Attorney, Agent, or Firm* — Jianq Chyun IP Office

(57) ABSTRACT

A delay-locked loop (DLL) and a method of using the DLL are provided. The DLL receives an external clock signal and outputs an internal clock signal. The DLL includes a variable delay line and a phase detector. The variable delay line delays the external clock signal and outputs a delayed external clock signal. The phase detector compares the phase of the external clock signal and the phase of the internal clock signal. The method includes the following steps: providing the delayed external clock signal directly to the phase detector of the DLL as the internal clock signal in a high frequency mode; and inverting the delayed external clock signal and providing an inverted delayed external clock signal to the phase detector as the internal clock signal in a low frequency mode.

7 Claims, 3 Drawing Sheets

DELAY-LOCKED LOOP AND METHOD OF USING THE SAME

BACKGROUND OF THE INVENTION

1. Field of the Invention

The present invention relates to a delay-locked loop (DLL) and a method of using the DLL. More particularly, the present invention relates to using a DLL in low-frequency applications.

2. Description of the Related Art

In general, a clock signal is used as a reference for adjusting the operational timing in a system or circuit, and also used to perform a faster operation without errors. When an external clock is used inside the system or circuit, a time delay (clock skew) occurs because the external clock signal has to pass many circuits and components to reach the inside circuits. A DLL compensates for the time delay, so that the internal clock signal can have the same phase as that of the external clock signal.

FIG. 1 is a schematic diagram showing a conventional DLL 100. The DLL 100 receives an external clock signal XCLK, outputs an internal clock signal ICLK, and includes a variable delay line 110, a phase detector 120, and a control circuit 130. The variable delay line 110 delays the external clock signal XCLK for a specific delay time and outputs the delayed external clock signal as the internal clock signal ICLK. The phase detector 120 compares the phase of the external clock signal XCLK and the phase of the internal clock signal ICLK and outputs the result of the comparison. The control circuit 130 adjusts the specific delay time of the variable delay line 110 according to the result of the comparison in order to synchronize the internal clock signal ICLK with the external clock signal XCLK.

The operational range of the DLL 100 is determined by the range of delay time of the variable delay line 110. In general, the operational range of a DLL is prescribed by the specification of the system or circuit to which the DLL belongs. For example, if the DLL 100 is a part of a double data rate synchronous dynamic random access memory (DDR SDRAM) and the maximum period of the clock of the DDR SDRAM is 15 nanoseconds, the DLL 100 cannot be normally operated according to a clock period over 30 nanoseconds.

For example, FIG. 2 is a schematic diagram showing a possible scenario of the clock signals XCLK and ICLK in the conventional DLL 100, wherein Tck is the period of the external clock signal XCLK and Tloop_max is the maximum loop delay of the DLL 100. In other words, Tloop_max is the maximum trip time spent by the external clock signal XCLK for one complete loop in the DLL 100. As shown in FIG. 2, the goal of the DLL 100 is aligning the positive edge TP of the internal clock signal ICLK to the positive edge TK of the external clock signal XCLK. However, aligning TP to TK is impossible because Tck is much longer than Tloop_max is.

When testing a DDR SDRAM, the clock frequency of the test apparatus is too low compared to the clock frequency of normal operation for the DLL to work properly. It is thus impossible to perform logic verification relating to the DLL or defect analysis on the DDR SDRAM in the wafer level. Since the test in the wafer level is incomplete without verification relating to the DLL, this results in a low yield in the package level.

SUMMARY OF THE INVENTION

Accordingly, the present invention is directed to a DLL with a simple and effective improvement suitable for low-frequency applications.

The present invention is also directed to a method of using a DLL for low-frequency applications.

According to an embodiment of the present invention, a DLL is provided. The DLL receives an external clock signal and outputs an internal clock signal. The DLL includes a variable delay line, an inverting circuit, a phase detector, and a control circuit. The variable delay line delays the external clock signal for a specific delay time and outputs the delayed external clock signal. The inverting circuit receives the delayed external clock signal as input. The inverting circuit outputs the delayed external clock signal directly as the internal clock signal in a high frequency mode. The inverting circuit inverts the delayed external clock signal and outputs the inverted delayed external clock signal as the internal clock signal in a low frequency mode. The high frequency mode and the low frequency mode are distinguished according to a comparison based on the period of the external clock signal and the maximum loop delay of the DLL. The phase detector compares the phase of the external clock signal and the phase of the internal clock signal, and outputs the result of the comparison of the phases. The control circuit adjusts the specific delay time of the variable delay line according to the result of the comparison of the phases in order to synchronize the internal clock signal with the external clock signal.

According to an embodiment of the present invention, the DLL is in the high frequency mode when Tck<Tloop_max. The DLL is in the low frequency mode when Tck>Tloop_max. Tck is the period of the external clock signal and Tloop_max is the maximum loop delay of the DLL.

According to an embodiment of the present invention, an off period of the external clock signal is set to be shorter than the maximum loop delay of the DLL in the low frequency mode. The off period is a period in which the external clock signal is not asserted in each cycle of the external clock signal.

According to an embodiment of the present invention, the inverting circuit includes two switches and an inverter. The first switch is coupled between the input terminal and the output terminal of the inverting circuit. The inverter has an input terminal coupled to the input terminal of the inverting circuit. The second switch is coupled between the output terminal of the inverter and the output terminal of the inverting circuit. In addition, the inverting circuit turns on the first switch and turns off the second switch in the high frequency mode, while the inverting circuit turns off the first switch and turns on the second switch in the low frequency mode.

According to another embodiment of the present invention, a method of using a DLL is provided. For example, the method may use the DLL in the embodiments above. The method includes the following steps: providing the delayed external clock signal directly to the phase detector of the DLL as the internal clock signal in the high frequency mode; and inverting the delayed external clock signal and providing the inverted delayed external clock signal to the phase detector as the internal clock signal in the low frequency mode.

According to an embodiment of the present invention, the method further includes setting the off period of the external clock signal to be shorter than the maximum loop delay of the DLL in the low frequency mode.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
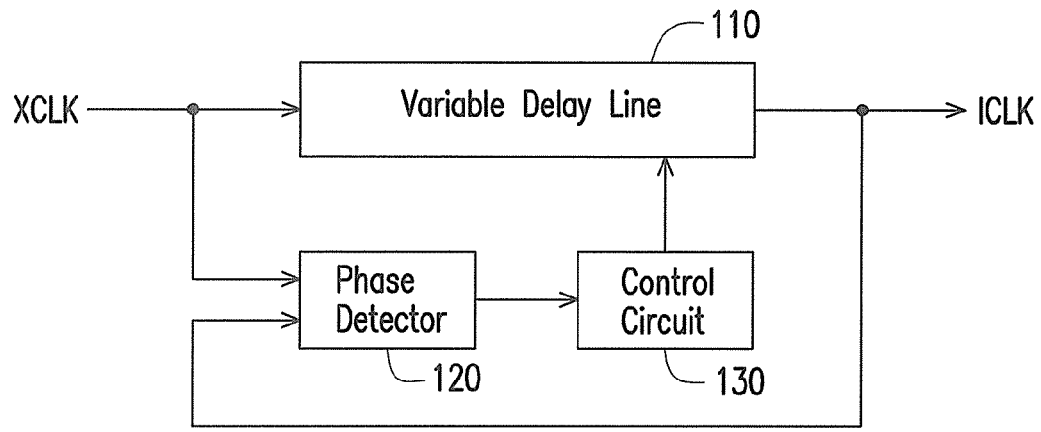
FIG. 1 is a schematic diagram showing a conventional DLL.
Figure 2:
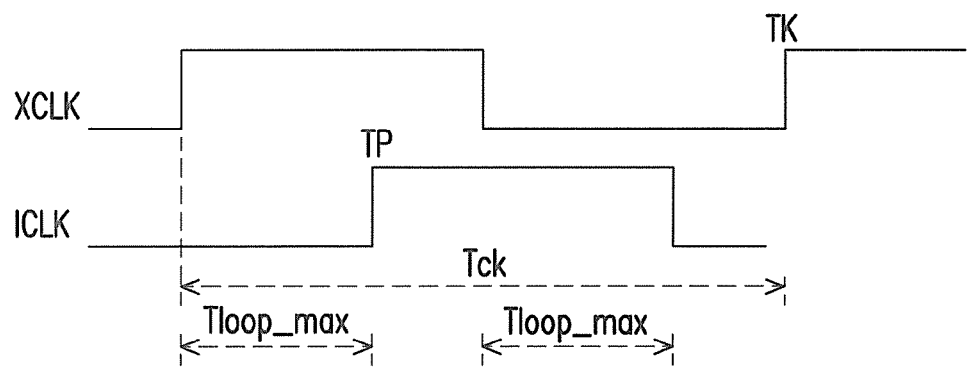
FIG. 2 is a schematic diagram showing an example of the clock signals in a conventional DLL.

Reference will now be made in detail to the present embodiments of the invention, examples of which are illustrated in the accompanying drawings. Wherever possible, the same reference numbers are used in the drawings and the description to refer to the same or like parts.

Figure 3:
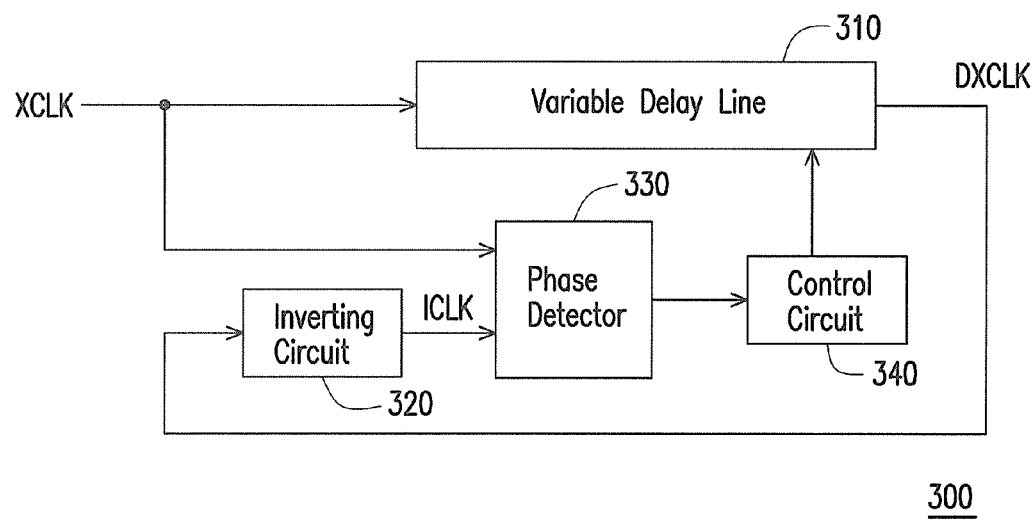
FIG. 3 is a schematic diagram showing a DLL according to an embodiment of the present invention.

FIG. 3 is a schematic diagram showing a DLL 300 according to an embodiment of the present invention. The DLL 300 receives an external clock signal XCLK and outputs an internal clock signal ICLK. The DLL 300 includes a variable delay line 310, an inverting circuit 320, a phase detector 330, and a control circuit 340.

The variable delay line 310 delays the external clock signal XCLK for a specific delay time and outputs the delayed external clock signal DXCLK. The inverting circuit 320 receives the delayed external clock signal DXCLK as input. The inverting circuit 320 outputs the delayed external clock signal DXCLK directly as the internal clock signal ICLK in a high frequency mode. On the other hand, the inverting circuit 320 inverts the delayed external clock signal DXCLK and outputs the inverted delayed external clock signal as the internal clock signal ICLK in a low frequency mode. The high frequency mode and the low frequency mode are distinguished according to a comparison based on the period of the external clock signal XCLK and the maximum loop delay of the DLL 300.

The phase detector 330 compares the phase of the external clock signal XCLK and the phase of the internal clock signal ICLK. The phase detector 330 outputs the result of the comparison of the phases. The control circuit 340 adjusts the specific delay time of the variable delay line 310 according to the result of the comparison of the phases output by the phase detector 330 in order to synchronize the internal clock signal ICLK with the external clock signal XCLK.

In this embodiment, the DLL 300 is in the high frequency mode when Tck<Tloop_max, while the DLL 300 is in the low frequency mode when Tck>Tloop_max. Tck is the period of the external clock signal XCLK and Tloop_max is the maximum loop delay of the DLL 300. Other similar criteria may apply in the other embodiments of the present invention.

Figure 4:
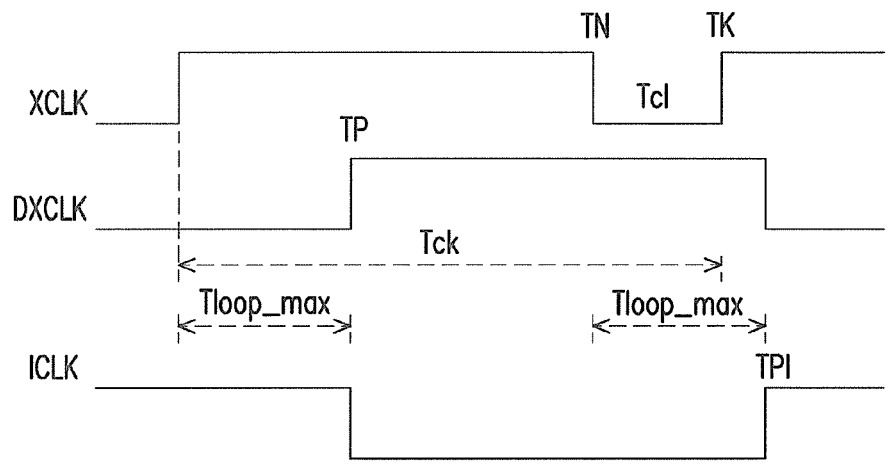
FIG. 4 is a schematic diagram showing an example of the clock signals in a DLL according to an embodiment of the present invention.

FIG. 4 is a schematic diagram showing an example of the clock signals in the DLL 300 according to an embodiment of the present invention. If the DLL 300 does not include the inverting circuit 320, the delayed external clock signal DXCLK would be output as the internal clock signal ICLK and the DLL 300 would have to align the positive edge TP of the delayed external clock signal DXCLK to the positive edge TK of the external clock signal XCLK, which is impossible because the period Tck of the external clock signal XCLK is much longer than the maximum loop delay Tloop_max of the DLL 300. As shown in FIG. 4, the off period Tel between the negative edge TN and the positive edge TK of the external clock signal XCLK is the period in which the external clock signal XCLK is not asserted in each cycle of the external clock signal XCLK. In the low frequency mode, the off period Tel of the external clock signal XCLK is set to be shorter than the maximum loop delay Tloop_max of the DLL 300. Also in the low frequency mode, the inverting circuit 320 inverts the delayed external clock signal DXCLK and outputs the inverted delayed external clock signal as the internal clock signal ICLK. The goal of the DLL 300 is aligning the positive edge TPI of the internal clock signal ICLK to the positive edge TK of the external clock signal XCLK, which is easy because both TK and TPI are in the range of Tloop_max.

Figure 5:
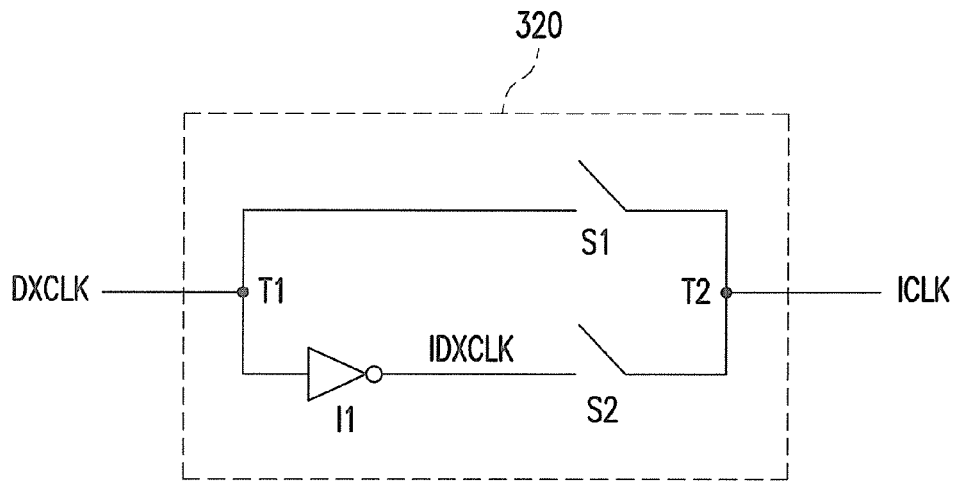
FIG. 5 is a schematic diagram showing an inverting circuit of a DLL according to an embodiment of the present invention.

FIG. 5 is a schematic diagram showing the inverting circuit 320 of the DLL 300 according to an embodiment of the present invention. The inverting circuit 320 includes an inverter I1 and two switches S1 and S2. The first switch S1 is coupled between the input terminal T1 and the output terminal T2 of the inverting circuit 320. The inverter I1 has an input terminal coupled to the input terminal T1 of the inverting circuit 320. The inverter I1 inverts the delayed external clock signal DXCLK and outputs the inverted delayed external clock signal IDXCLK. The second switch S2 is coupled between the output terminal of the inverter I1 and the output terminal T2 of the inverting circuit 320. The inverting circuit 320 turns on the first switch S1 and turns off the second switch S2 in the high frequency mode. The inverting circuit 320 turns off the first switch S1 and turns on the second switch S2 in the low frequency mode. The DLL 300 or the inverting circuit 320 may detect the current mode automatically and generate corresponding control signals to turn on or turn off the switches S1 and S2. Alternatively, the switches S1 and S2 may be controlled by external control signals from outside the DLL 300.

Figure 6:
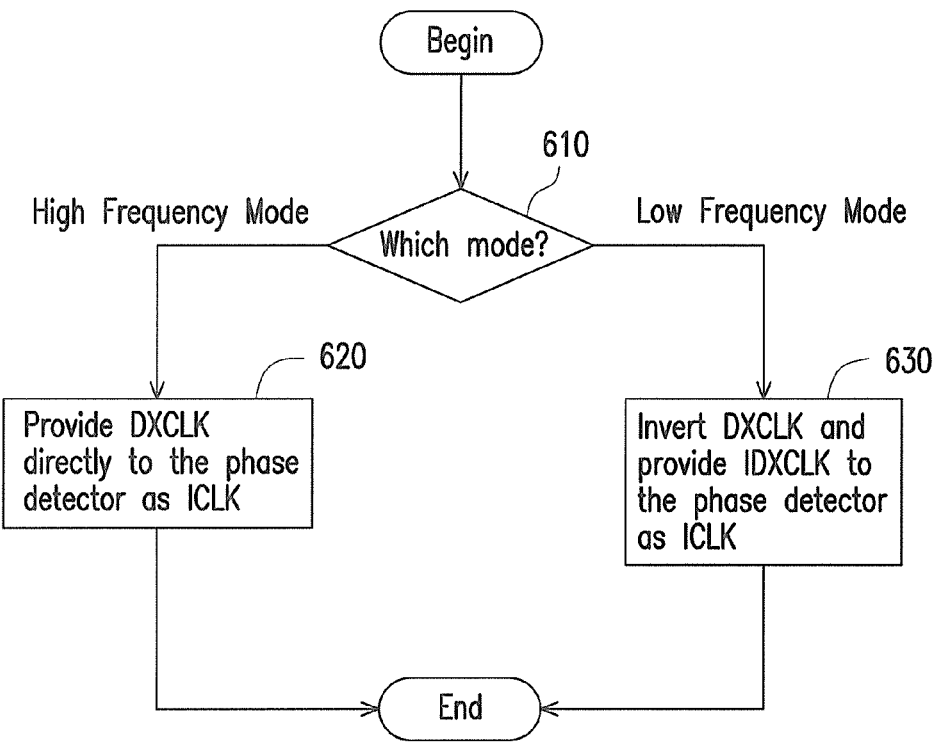
FIG. 6 is a flow chart showing a method of using a DLL according to an embodiment of the present invention.

FIG. 6 is a flow chart showing a method of using a DLL according to an embodiment of the present invention. The method may use the DLL 300 shown in FIG. 3 or another similar DLL. The flow of the method begins at step 610. First, determine the current mode (step 610). If it is the high frequency mode, provide the delayed external clock signal DXCLK directly to the phase detector of the DLL as the internal clock signal ICLK (step 620). If it is the low frequency mode, invert the delayed external clock signal DXCLK and provide the inverted delayed external clock signal IDXCLK to the phase detector as the internal clock signal ICLK (step 630).

In some other embodiments of the present invention, step 630 may include an additional action of setting the off period Tcl of the external clock signal XCLK to be shorter than the maximum loop delay Tloop_max of the DLL in the low frequency mode.

In summary, the present invention provides a DLL with a simple and low-cost improvement. The DLL provided by the present invention can be operated normally in both the high frequency mode and the low frequency mode. Besides, the present invention provides a method of using a DLL in both the high frequency mode and the low frequency mode.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A delay-locked loop (DLL), receiving an external clock signal and outputting an internal clock signal, comprising:

a variable delay line, delaying the external clock signal for a specific delay time and outputting a delayed external clock signal;

an inverting circuit, receiving the delayed external clock signal as input, outputting the delayed external clock signal directly as the internal clock signal in a high frequency mode, inverting the delayed external clock signal and outputting an inverted delayed external clock signal as the internal clock signal in a low frequency mode, wherein the high frequency mode and the low frequency mode are distinguished according to a comparison based on a period of the external clock signal and a maximum loop delay of the DLL;

a phase detector, comparing a phase of the external clock signal and a phase of the internal clock signal, and outputting a result of the comparison of the phases; and a control circuit, adjusting the specific delay time of the variable delay line according to the result of the comparison of the phases in order to synchronize the internal clock signal with the external clock signal.

2. The DLL of claim 1, wherein the DLL is in the high frequency mode when Tck<Tloop_max, the DLL is in the low frequency mode when Tck>Tloop_max, Tck is the period of the external clock signal and Tloop_max is the maximum loop delay of the DLL.

3. The DLL of claim 1, wherein an off period of the external clock signal is set to be shorter than the maximum loop delay of the DLL in the low frequency mode, the off period is a period in which the external clock signal is not asserted in each cycle of the external clock signal.

4. The DLL of claim 1, wherein the inverting circuit comprises:

a first switch coupled between an input terminal and an output terminal of the inverting circuit;

an inverter having an input terminal coupled to the input terminal of the inverting circuit; and a second switch coupled between an output terminal of the inverter and the output terminal of the inverting circuit, wherein the inverting circuit turns on the first switch and turns off the second switch in the high frequency mode, the inverting circuit turns off the first switch and turns on the second switch in the low frequency mode.

5. A method of using a delay-locked loop (DLL) receiving an external clock signal and outputting an internal clock signal, wherein the DLL comprises a variable delay line and a phase detector, the variable delay line delays the external clock signal and outputs a delayed external clock signal, the phase detector compares a phase of the external clock signal and a phase of the internal clock signal, and the method comprises:

providing the delayed external clock signal directly to the phase detector as the internal clock signal in a high frequency mode; and inverting the delayed external clock signal and providing an inverted delayed external clock signal to the phase detector as the internal clock signal in a low frequency mode, wherein the high frequency mode and the low frequency mode are distinguished according to a comparison based on a period of the external clock signal and a maximum loop delay of the DLL.

6. The method of claim 5, wherein the DLL is in the high frequency mode when Tck<Tloop_max, the DLL is in the low frequency mode when Tck>Tloop_max, Tck is the period of the external clock signal and Tloop_max is the maximum loop delay of the DLL.

7. The method of claim 5, further comprising:

setting an off period of the external clock signal to be shorter than the maximum loop delay of the DLL in the low frequency mode, wherein the off period is a period in which the external clock signal is not asserted in each cycle of the external clock signal.

* * * * *